United States Patent
Zhou et al.

(10) Patent No.: US 7,256,488 B2
(45) Date of Patent: Aug. 14, 2007

(54) SEMICONDUCTOR PACKAGE WITH CROSSING CONDUCTOR ASSEMBLY AND METHOD OF MANUFACTURE

(75) Inventors: Yaping Zhou, Austin, TX (US); Chu-Chung Lee, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/388,646

(22) Filed: Mar. 24, 2006

(65) Prior Publication Data

US 2006/0163716 A1 Jul. 27, 2006

Related U.S. Application Data

(62) Division of application No. 11/270,300, filed on Nov. 9, 2005, now Pat. No. 7,049,694, which is a division of application No. 10/787,288, filed on Feb. 26, 2004, now Pat. No. 6,992,377.

(51) Int. Cl.
*H01L 23/48* (2006.01)
*H01L 23/52* (2006.01)

(52) U.S. Cl. ............... 257/690; 257/692; 257/784; 257/786; 438/123

(58) Field of Classification Search .......... 257/674, 257/690, 692, 784, 786; 438/123
See application file for complete search history.

(56) References Cited

U.S. PATENT DOCUMENTS 5,004,317 A 4/1991 Jackson et al.
6,031,281 A 2/2000 Kang et al.
6,177,726 B1 * 1/2001 Manteghi .............. 257/725
6,469,260 B2 10/2002 Horuichi et al.
6,894,398 B2 * 5/2005 Pon .......................... 257/786

FOREIGN PATENT DOCUMENTS

| EP | 0 276 940 A2 | 8/1988 |
| WO | WO 98/26452 | 6/1998 |
| WO | WO 02/080272 A2 | 10/2002 |

* cited by examiner

*Primary Examiner*—Phat X. Cao
(74) *Attorney, Agent, or Firm*—Robert L. King

(57) ABSTRACT

A semiconductor package uses various forms of conductive traces that connect to die bond pads via bond wires. In one form, adjacent bond wires are intentionally crossed around midpoints thereof to reduce self-inductance of the conductors and to minimize self-inductance. In another form, bond wires associated with bond pads having intervening, unrelated bond pads are crossed. Additionally, conductive traces are divided into separate sections and electrically connected by crossed jumper wires or bond wires. Any number of separate sections may be formed for each trace, but an even number is preferable. In another form, one trace is continuous and divides a second trace into two or more sections. The multiple sections are connected by an overlying bond wire. Either insulated or non-insulated bond wire may be used.

11 Claims, 7 Drawing Sheets

SEMICONDUCTOR PACKAGE WITH CROSSING CONDUCTOR ASSEMBLY AND METHOD OF MANUFACTURE

This application is a Divisional of 11/270,300, filed Nov. 9, 2005, U.S. Pat. No. 7,049,694 and which is a Divisional of 10/787,288, filed Feb. 26, 2004, U.S. Pat. No. 6,992,377.

FIELD OF THE INVENTION

This invention relates generally to packaging of semiconductors, and more specifically, to semiconductor packages using wire bonding.

BACKGROUND OF THE INVENTION

One form of integrated circuits commonly manufactured uses wire bonding to electrically connect bond pads of a semiconductor die to electrical conductors commonly referred to as traces in a substrate. Integrated circuits therefore typically use uninsulated or bare bond wires that are made of metal such as gold, silver, aluminum or copper. Therefore, the bond wires may electrically short circuit if they come into contact with each other. In order to prevent contact between bond wires, integrated circuits are typically designed such that the bare bond wires do not physically cross or overlap each other. In order to meet this design constraint, the circuitry of the integrated circuit must be designed to keep the bare bond wires from crossing. This design constraint may result in a physical layout that is not optimal for size. Additionally, bare bond wires may sag into other bare bond wires when hot plastic is molded over the integrated circuit assembly. If hot plastic is molded over the integrated circuit, the hot plastic may push the bare bond wires together. To prevent this problem, additional spacing has been included between the bond wire sites.

Additional semiconductor packaging issues must be taken into consideration when using a wire bonding assembly. For example, when either two bond wires or two traces are in close proximity, there is noise coupling commonly found between the two bond wires or two traces. To minimize the negative effects of noise coupling or crosstalk noise, designers commonly separate digital circuitry from analog circuitry. However, this bifurcation often places undesirable design restraints on the design of an integrated circuit and can cause inefficient use of circuit space. When closely positioned adjacent wires or traces exist across a span between an integrated circuit die and a packaging assembly, there is no closely positioned reference plane to minimize the effects of noise from adjacent wires or traces. The noise that gets coupled into the bond wires and traces results in operating error.

An additional source of noise that contributes to error in a semiconductor package using bond wire is from the self inductance of the bond wires and traces themselves. The inductance of the conductor modifies the electrical characteristics of the signal path and therefore the circuit's operation is modified.

BRIEF DESCRIPTION OF THE DRAWINGS

The foregoing and further and more specific objects and advantages of the instant invention will become readily apparent to those skilled in the art from the following detailed description of the invention taken in conjunction with the following drawings.

The drawings are not necessarily drawn to scale and portions are disproportionately enlarged for purposes of illustration and explanation.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
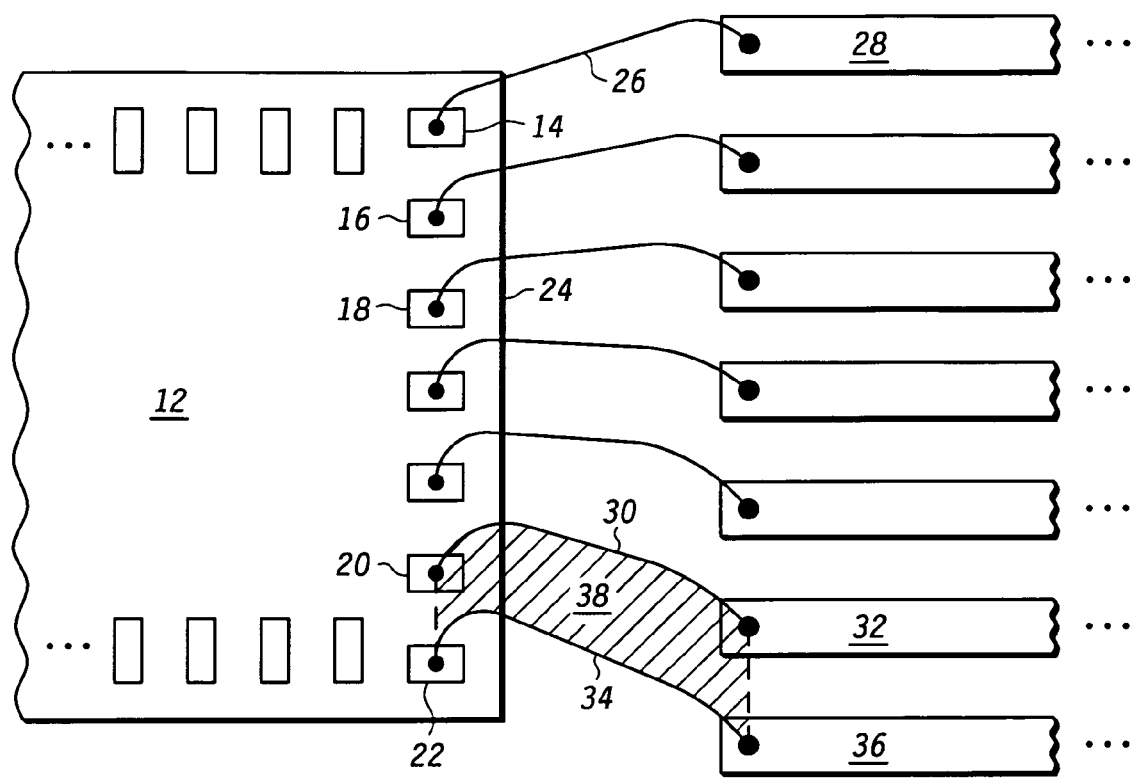
FIG. 1 illustrates in perspective form a known semiconductor device using wire bonding.

Illustrated in FIG. 1 is a known semiconductor device 10 generally having a die 12 for electrical connection to a plurality of conductive substrate traces. In particular, die 12 has a plurality of bond pads along each periphery thereof, such as side 24. In the illustrated form, bond pads 14, 16, 18, 20 and 22 are provided. Each bond pad along side 24 is connected to a conductive trace. For example, bond pad 14 is connected to conductive trace 28 via a bond wire 26. Bond pad 20 is connected to trace 32 via a bond wire 30, and bond pad 22 is connected to trace 36 via a bond wire 34. It should be noted that in a two-dimensional perspective a substantially rectangular region 38 is formed between the bond wire 30 and bond wire 34 defined with ends at bond pads 20 and 22 and conductive traces 32 and 36.

In operation, there is noise that is coupled into each of the bond wires, including bond wires 26, 30 and 34. One of the sources of noise is from the other bond wires that are in close proximity. The amount of noise that is injected into the bond wires is a function of both the self inductance of the bond wires and traces and the mutual inductance between the bond wires and between the traces. Additional factors that influence the noise coupling include the type of signals that are adjacent each other along the side 24. For example, if an analog signal is adjacent a digital signal, the analog signal will receive noise each time the digital signal transitions between logic values. As a result, the design of the circuitry implemented in die 12 must take into consideration the placement of the types of signals routed along the periphery of the die to the outside. The design of the circuitry is therefore constrained to certain placement and size inefficiency in order to minimize the noise that gets coupled into signal paths by bond wires and traces.

Figure 2:
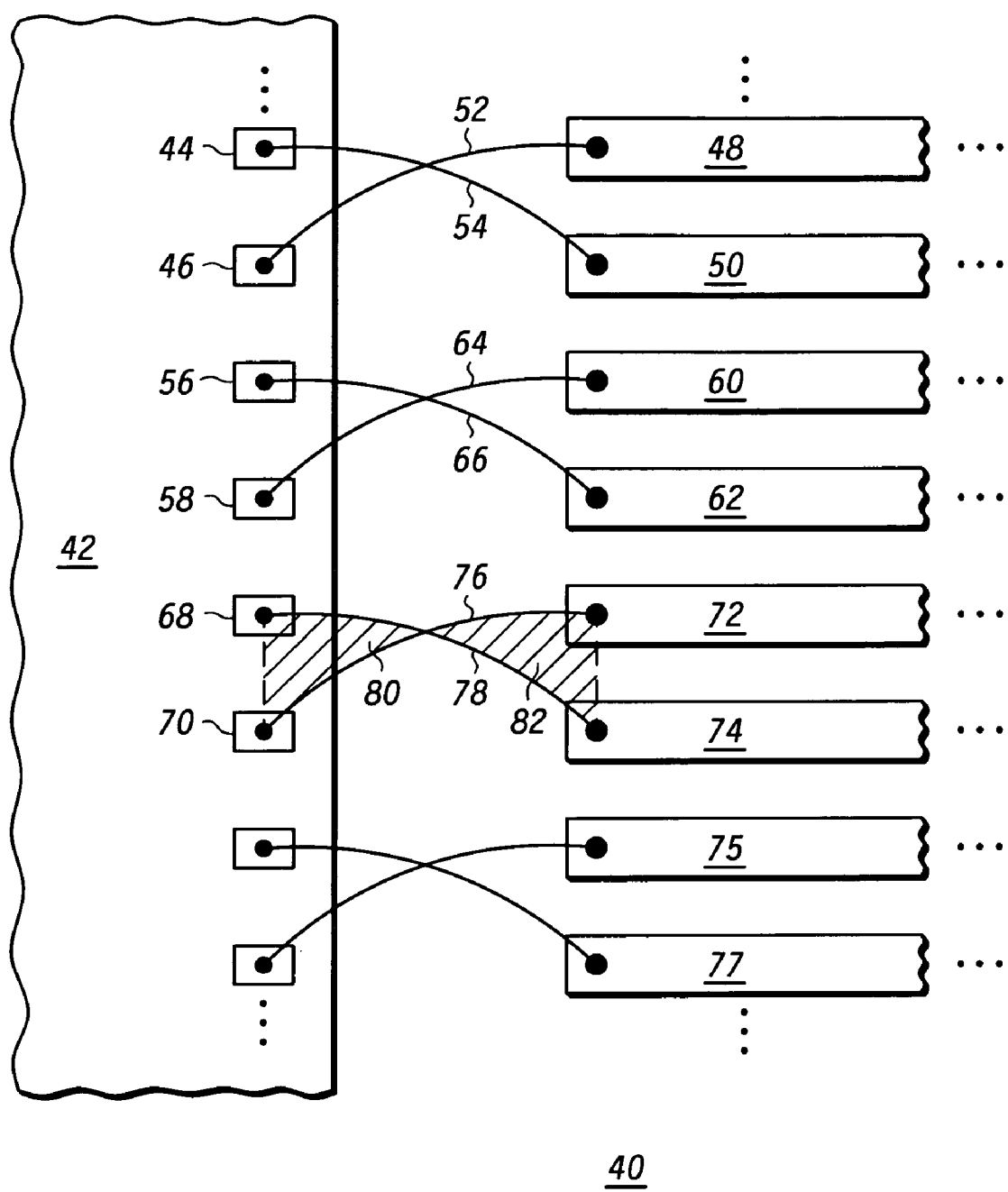
FIG. 2 illustrates in perspective form a semiconductor device having wire bonding in accordance with one form of the present invention.

Illustrated in FIG. 2 is a semiconductor device 40 that reduces the noise sources as described above in connection with FIG. 1. A die 42 has a plurality of bond pads, such as bond pads 44, 46, 56, 58, 68 and 70, positioned along a side of die 42. Each bond pad is respectively connected to an external conductive trace, such as conductive traces 48, 50, 60, 62, 72, 74, 75 and 77, by a bond wire. For example, bond wire 52 connects bond pad 46 to conductive trace 48. Bond wire 54 overlaps and crosses bond wire 52 at approximately a midpoint in the length of each of bond wire 52 and bond wire 54. Bond wire 54 connects bond pad 44 to conductive trace 50. Similarly, a bond wire 64 is overlapped and crossed by bond wire 66. Bond wire 64 connects bond pad 58 to a conductive trace 60. Bond wire 66 connects bond pad 56 to a conductive trace 62. A bond wire 76 is overlapped and crossed by a bond wire 78. Bond wire 76 connects bond pad 70 to a conductive trace 72. Bond wire 78 connects bond pad 68 to a conductive trace 74. It should be noted that in a two-dimensional perspective two substantially triangular regions 80 and 82 are formed by the bond wires 76 and 78 respectively defined with ends at bond pads 68 and 70 and conductive traces 72 and 74. As noted by the dots in FIG. 2, additional bond pads are contemplated along the side of die 42 as well as additional conductive traces. Further, the length of the conductive traces may be made to fit a particular example and may include angled sections.

In operation, semiconductor device 40 functions to minimize the amount of noise that is coupled into each of the bond wires. By crossing adjacent pairs of bond wires at substantially a midpoint thereof, the amount of noise that is injected into each bond wire is significantly reduced from that of semiconductor device 10 of FIG. 1. It should be noted that while all bond wire pairs of semiconductor device 40 are illustrated as originating from a side of die 42, the bond wires may be located anywhere within die 42, including the central region of die 42. Also, not all of the bond wires on a side of a die necessarily need to be crossed with another bond wire.

Figures 3, 4:
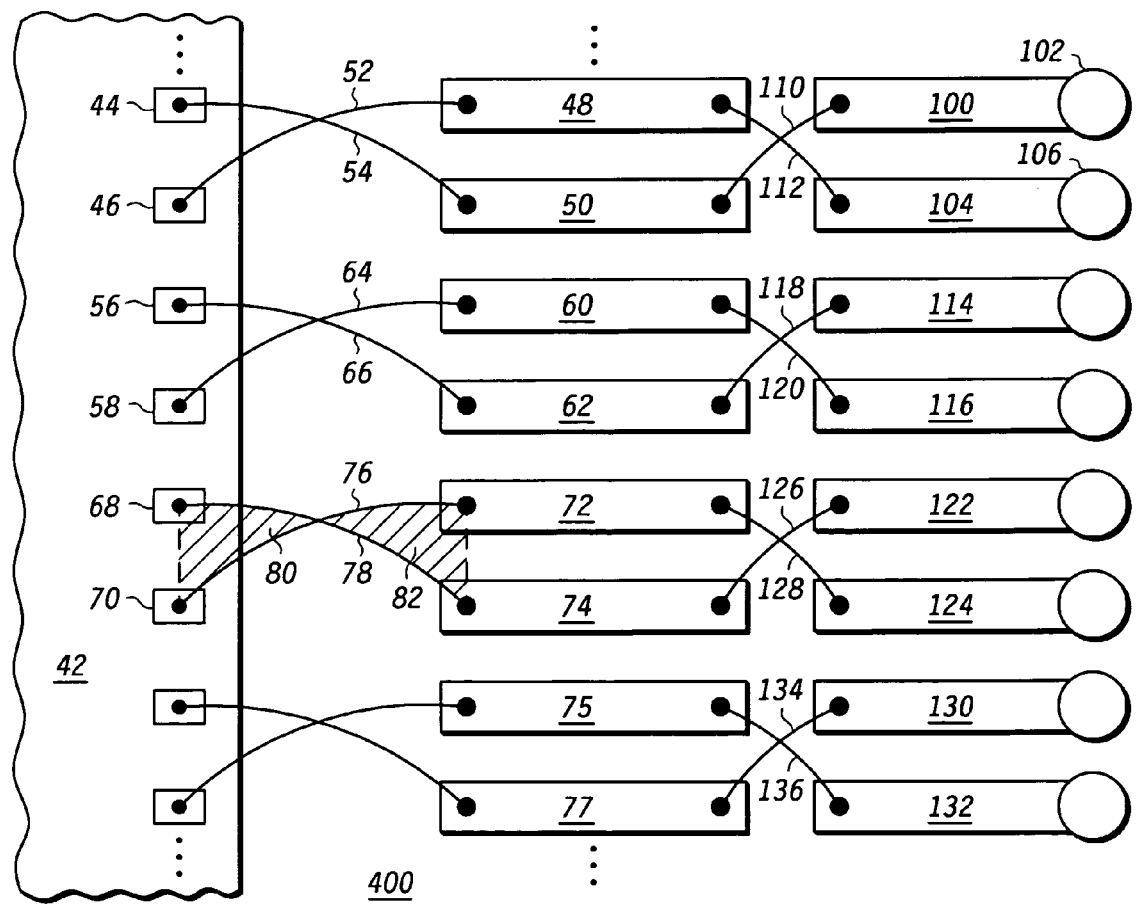
FIG. 3 illustrates in perspective form coupling area associated with two conductors when in parallel as opposed to being crossed.
FIG. 4 illustrates in perspective form a semiconductor device having wire bonding in accordance with another form of the present invention.

Illustrated in FIG. 3 is a comparison between two parallel conductors, bond wire 30 and bond wire 34 of FIG. 1 and bond wire 76 and bond wire 78 of FIG. 2. Bond wire 30 and bond wire 34 form a region 38. As a result of the significantly reduced area of the separation between the two bond wires when the bond wires are crossed, the amount of self inductance of the bond wires is reduced by at least one-half. In addition to reducing noise by reducing the amount of self-inductance of the bond wires, introduced noise is minimized by reducing cross-talk when bond wires are crossed. When bond wires are crossed at the middle point of the bond wires and an external uniform magnetic field exists, the bond wires do not pick up any noise from the magnetic field. This can be seen in FIG. 3 wherein the magnetic flux of region 80 of FIG. 2 is equal to but opposite in polarity to the magnetic flux of region 82 of FIG. 2. It should be noted that if the magnetic field is not uniform, the conductors do absorb some noise but the noise magnitude is nonetheless greatly reduced as a result of the structure provided herein. The magnetic flux of region 38, Φ, is equal to the product of the magnetic field and the area of region 38. Similarly, the magnetic flux of regions 80 and 82, Φ, is equal to the product of the magnetic field and the combined area of regions 80 and 82. It can be noted that bond wire 78 is positioned on the left in the upper portion of region 80 and on the right in the lower portion of region 82. Therefore, when an external magnetic field is applied, the opposite polarity of magnetic flux results. As a result, the collective magnetic flux between bond wires 76 and 78 is zero. In contrast, there is no subtractive effect associated with the magnetic flux of region 38 of FIG. 1. It should be noted that if the magnetic field is in fact not uniform across regions 80 and 82, there is some resulting magnetic flux that gets coupled into each bond wire conductor. However, the noise magnitude is greatly reduced. Also, if bond wires 76 and 78 do not cross at a midpoint in their respective lengths, the two triangular regions are not the same area. Therefore, there will also be some resulting magnetic flux. However, it should be noted that significant noise reduction nevertheless occurs as the magnetic flux of the two resulting triangular regions subtract from each other.

Illustrated in FIG. 4 is a semiconductor device 400. Elements that are common with semiconductor device 40 of FIG. 2 will be numbered identically for purposes of simplifying the explanation. Each of traces 48, 50, 60, 62, 72, 74, 75 and 77 is broken into two regions. Trace 48 is extended via an intervening gap or space by an extension 100 that is substantially along a same central axis perpendicular to a side of die 42. At an end of extension 100 is a via 102 for electrical contact to an underlying substrate that supports semiconductor device 400. Similarly, trace 50 is extended via an intervening space by an extension 104. At an end of extension 104 is a via 106 for electrical contact to the underlying substrate. Trace 60 is extended via an intervening space by an extension 114, and trace 62 is extended via an intervening space by an extension 116. Trace 72 is extended via an intervening space by an extension 122, and trace 74 is extended via an intervening space by an extension 124. A trace 75 is extended via an intervening space by an extension 130, and a trace 77 is extended via an intervening space by an extension 132. Each of extensions 114, 116, 122, 124, 130 and 132 is terminated with a via (not numbered) as were extensions 100 and 104. A bond wire 110 connects trace 50 with extension 100. A bond wire 112 crosses bond wire 110 at substantially a midpoint of both of the bond wires and connects trace 48 with extension 104. A bond wire 118 connects trace 62 to extension 114. A bond wire 120 crosses bond wire 110 at substantially a midpoint of both of the bond wires and connects trace 60 to extension 116. A bond wire 126 connects trace 74 with extension 122. A bond wire 128 crosses bond wire 126 at substantially a midpoint of both of the bond wires and connects trace 72 to extension 124. A bond wire 134 connects trace 77 to extension 130. A bond wire 136 crosses bond wire 134 at substantially a midpoint of both of the bond wires and connects trace 75 to extension 132.

In the illustrated form, semiconductor device 400 functions to reduce noise error not only introduced in the bond wires but also functions to reduce noise error introduced in the conductive traces. By using crossed bond wires to connect segmented portions of the conductive traces, magnetic flux between the conductive traces is cancelled. For example, when trace 48 and extension 100 are the same length and when trace 50 and extension 104 are the same length, the magnetic flux coupled into each conductor is offset by crossing the conductor portions using bond wires 110 and 112 at the middle of each wire span. Therefore, noise error is reduced in both bond wires 52, 54 and in conductive traces 48, 50.

By crossing bond wire 110 and bond wire 112 over a central portion of the conductive traces formed by traces 48 and 50 and respective extensions 100 and 104, cross talk is reduced. A magnetic field generated by aggressor signals will generate a magnetic flux of a first polarity between conductive traces 48 and 50. Similarly, the magnetic field will generate an equal but opposite polarity magnetic flux between extensions 100 and 104. Therefore, by connecting conductive trace 48 and extension 104 with bond wire 112, and connecting conductive trace 50 and extension 100 with bond wire 110, the noise introduced into both conductive traces 48 and 50 and extensions 100 and 104 by a magnetic field is minimized.

Figure 5:
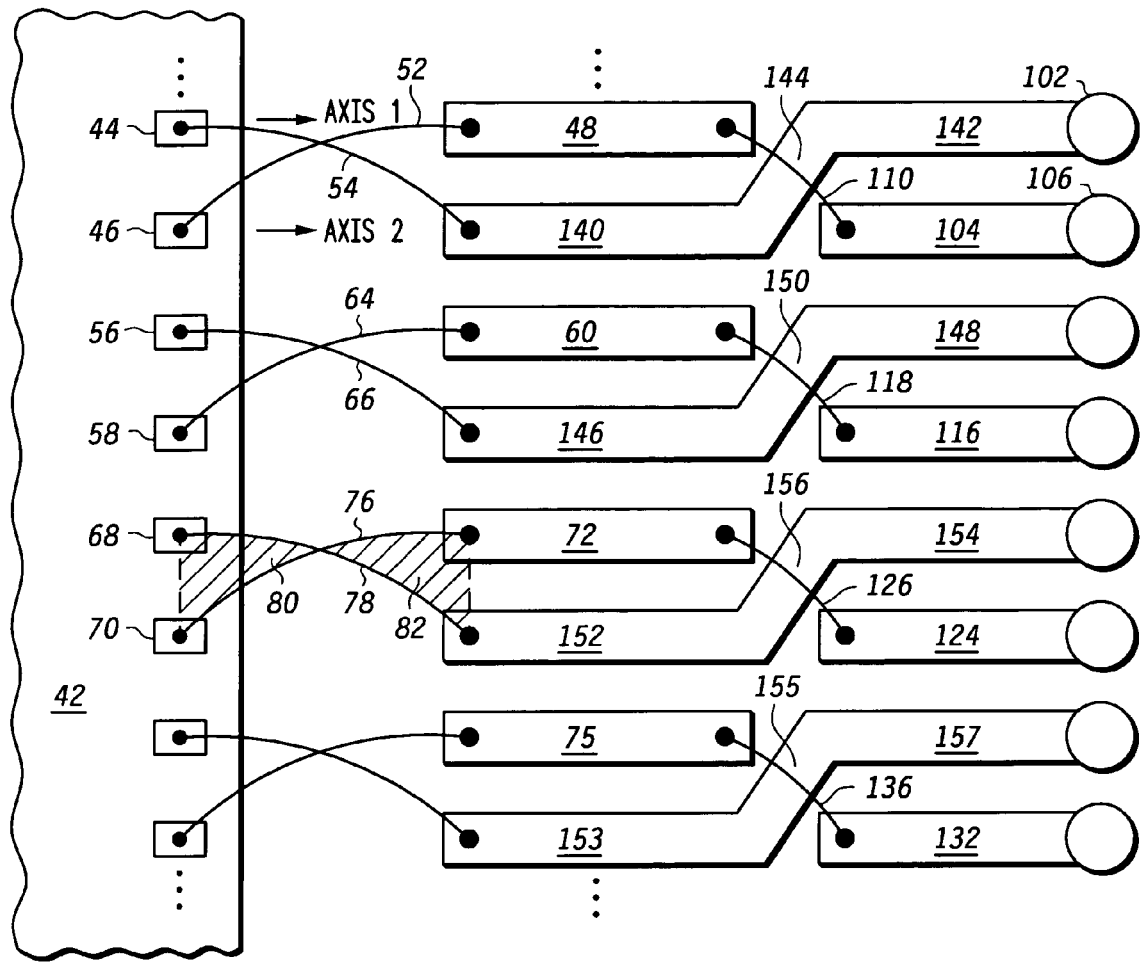
FIG. 5 illustrates in perspective form a semiconductor device having wire bonding in accordance with another form of the present invention.

Illustrated in FIG. 5 is a semiconductor device 4000. Elements that are common with semiconductor device 40 of FIG. 2 will be numbered identically for purposes of simplifying the explanation. Only some of the illustrated traces are segmented to reduce noise coupling to the traces. For example, trace 48 is separated and continued by extension 104 and connected together by bond wire 110. Trace 48 is offset from a side of die 42 and extends substantially perpendicular from the side of die 42 along an axis identified as "Axis 1". Instead of trace 50 of FIG. 4, a trace having a trace portion 140, a trace portion 144 and a trace portion 142 is provided. Trace portion 140 is also offset from a side of die 42 by approximately the same amount as trace 48 is offset. Trace portion extends substantially perpendicular from the side of die 42 along an axis identified as "Axis 2". The physically separate extension 104 is also positioned along Axis 2. Trace portion 142 is also positioned along Axis 1. The trace terminates with via 102. It should be noted that bond wire 110 extends across substantially the middle of central trace portion 144. Similarly a trace having a trace portion 146, a central trace portion 150 and a trace portion 148 is provided. A trace having a trace portion 152, a central trace portion 156 and a trace portion 154 is provided. Bond wire 118 connects conductive trace 60 to extension 116 by extending across substantially the middle of central trace portion 150. Bond wire 126 connects conductive trace 72 to extension 124 by extending across substantially the middle of central trace portion 156. A trace having a trace portion 153, a central trace portion 155 and a trace portion 157 is provided. Bond wire 136 connects conductive trace 75 to extension 132 by extending across substantially the middle of central trace portion 155.

In operation, semiconductor device 4000 uses bond wires, such as bond wires 52 and 54, that cross at a midpoint to electrically connect bond pads of die 42 to predetermined conductive traces. Additionally, jumper wires or non-crossing bond wires, such as bond wires 110 and 118, are used to electrically connect alternating conductive traces, such as traces 48 and 60, to conductive trace extensions that are in a different axis extending away from the side of the die 42. For example, conductive trace 48 is positioned in a first axis and extension 104 is positioned in a second axis. By extending bond wire 110 over a central portion of the conductive trace formed by portions 140, 144 and 142, cross talk is reduced. A magnetic field generated by aggressor signals will generate a magnetic flux of a first polarity between portions 140, 144 and conductive trace 48. Similarly, the magnetic field will generate an equal but opposite polarity magnetic flux between portions 144, 142 and extension 104. Therefore, by connecting conductive trace 48 and extension 104 with bond wire 110, the noise introduced into both conductive traces by a magnetic field is minimized. In another form, each or some or the continuous conductive traces may be further extended (not shown) in contoured form and surrounded by additional extensions (not shown), such as extension 104, on alternating sides of the extended continuous conductive trace.

Figure 6:
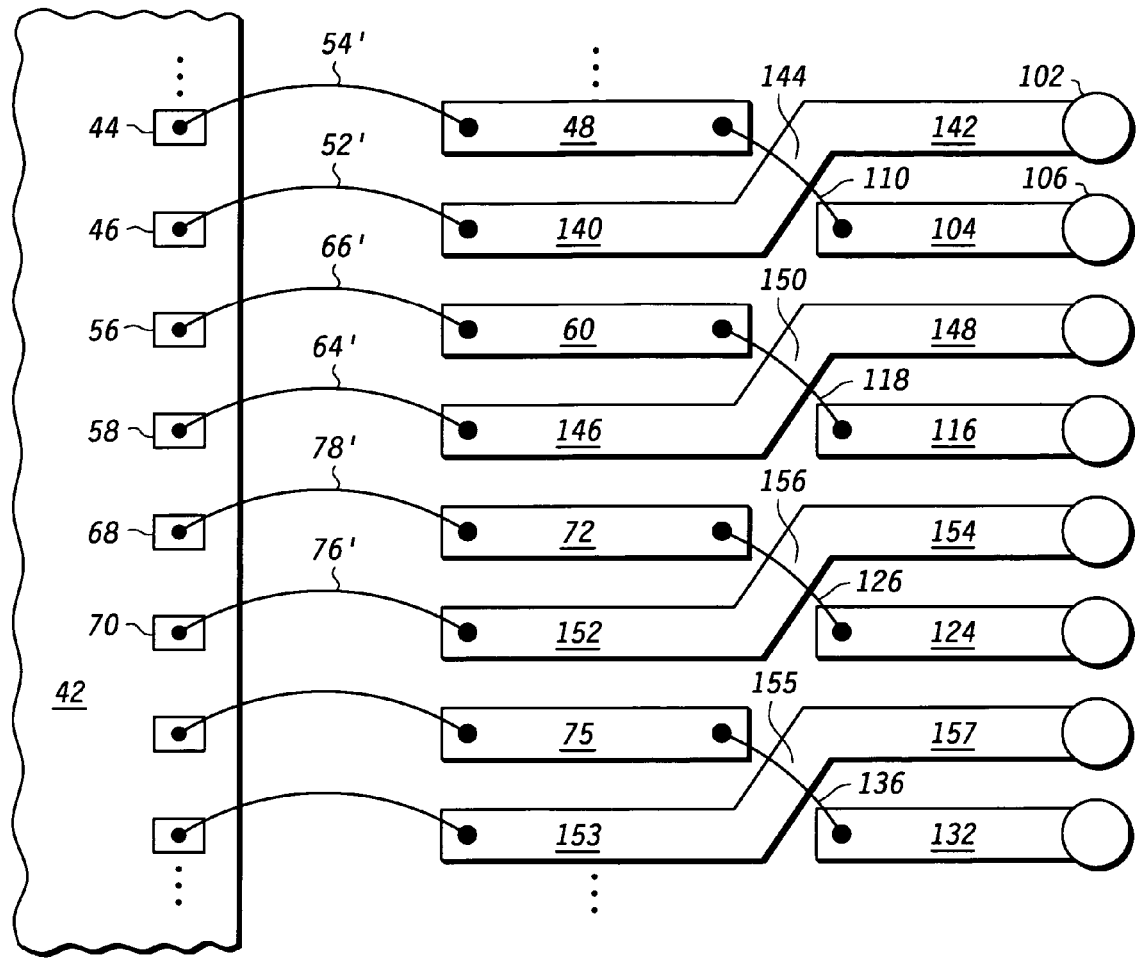
FIG. 6 illustrates in perspective form a semiconductor device having wire bonding in accordance with another form of the present invention.

Illustrated in FIG. 6 is a semiconductor device 40000. Elements that are common with semiconductor device 40000 of FIG. 5 will be numbered identically for purposes of simplifying the explanation. Semiconductor device 40000 differs from semiconductor device 4000 of FIG. 5 primarily in the wire bonding structure and method used to initially connect the bond pads 44, 46, 56, 58, 68, 70, etc. of die 42 to a respective predetermined conductive trace. Non-overlapping bond wires are used. A bond wire 54' connects bond pad 44 to conductive trace 48. A bond wire 52' connects bond pad 46 to trace portion 140. A bond wire 66' connects bond pad 56 to conductive trace 60. A bond wire 64' connects bond pad 58 to trace portion 146. A bond wire 78' connects bond pad 68 to conductive trace 72. A bond wire 76' connects bond pad 70 to trace portion 152. Bond wires 54', 52', 66', 64', 78' and 76' are substantially parallel to each other. The same conductive trace structure and bond wire pattern present in semiconductor device 4000 of FIG. 5 is used in semiconductor device 40000.

In operation, semiconductor device 40000 uses non-crossing bond wires, such as bond wires 54', 52', etc., and jumper or non-crossing bond wires, such as bond wires 110, 118, etc., to minimize external noise in the conductive traces. Unlike the embodiments of FIGS. 2 through 5, semiconductor device 40000 contains no locations where two crossing bond wires are present. As a result, reliability may be improved for those applications where uninsulated wire is used. Cancellation of noise introduced into the conductive traces by a magnetic field from aggressor signals occurs in the same manner as described above in connection with FIG. 5.

Figure 7:
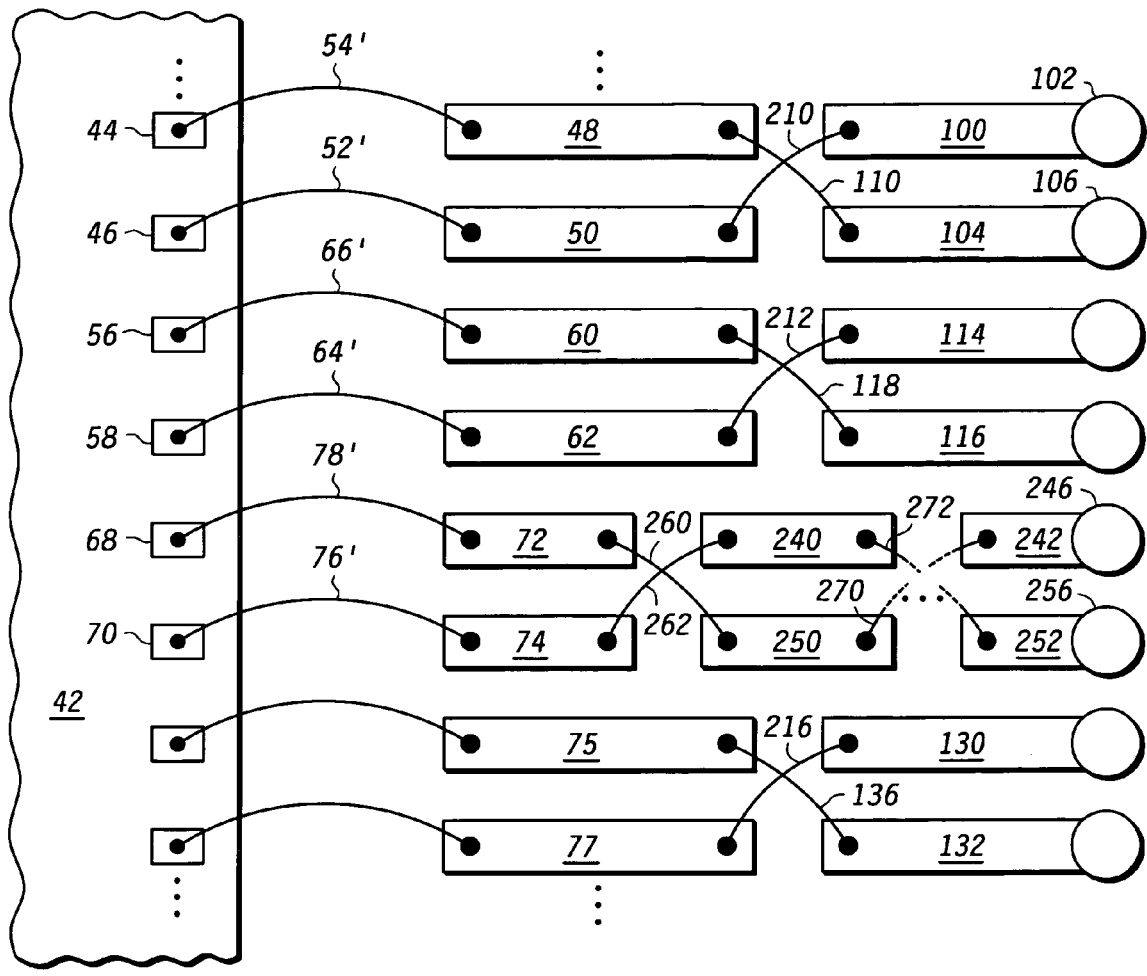
FIG. 7 illustrates in perspective form a semiconductor device having wire bonding in accordance with another form of the present invention.

Illustrated in FIG. 7 is a semiconductor device 400000 which is yet another embodiment of a semiconductor package with a crossing conductor assembly. Elements that are common with semiconductor device 400 of FIG. 4 are numbered identically for purposes of simplifying the explanation. Semiconductor device 400000 differs from semiconductor device 400 of FIG. 4 primarily by illustrating that for some or all of the conductive traces, multiple connected sections of the conductive traces may be used to achieve minimal cross-talk interference. For example, instead of conductive traces 72 and 74 and extensions 122 and 124, semiconductor device has a plurality of extensions provided along each axis that each of conductive trace 72 and conductive trace 74 lie along. For example, along a same axis that is perpendicular to a side of die 42 and in which conductive trace 72 is positioned, there is also extension 240, extension 242 and one or more additional extensions as noted by the intervening dots. Along a same axis that is perpendicular to a side of die 42 and in which conductive trace 74 is positioned, there is also extension 250, extension 252 and one or more additional extensions as noted by the intervening dots. In a preferred form, each axis contains an even number of metal segments (conductive trace plus extensions).

In operation, usually the external magnetic field generated by one or more aggressor signals is not uniform across an entire length of a conductive trace. To compensate for the nonuniformity of the magnetic field, multiple even-numbered trace extensions may be used along a same axis perpendicular to a side of the die 42. For example, an even number of conductive sections, such as conductive trace 72 and extensions 240 through 242 may be implemented. Compensation for injected noise occurs as described above due to the symmetry with adjoining conductive traces. When there is an even number of pairs of conductive sections, such as conductive traces 72 and 74, extensions 240 and 250, etc., there is symmetry so that there are equal areas of opposing magnetic flux as will be described below. Additionally, non-crossing bond wires, such as bond wires 54', 52', etc., are used with crossing bond wires, such as bond wires 110, 210, 118, 212, etc. In the area between conductive trace 72 and conductive trace 74, there is a fixed amount of magnetic flux from external noise sources. Assuming that the magnetic field is uniform across the entire length of the conductors, there is an equal amount of magnetic flux between extension 240 and extension 250. However, due to crossing bond wires 260 and 262, the magnetic flux between conductive traces 72 and 74 is of opposite polarity to the magnetic flux between extensions 240 and 250. Therefore, the resulting magnetic flux is zero or near-zero.

In another form, semiconductor device 400000 of FIG. 7 may be implemented with predetermined pairs of bond wires from the bond pads of die 42 physically crossed as in FIGS. 4 and 5. Such a choice depends upon the application and the amount of noise error that may be tolerated. Although the non-crossed bond wires, such as 76', 78', etc., are themselves susceptible to noise, if the bond wires are short, the error is often tolerable. However, conductive traces are typically lengthy enough that noise compensation is needed. Semiconductor device 400000 therefore provides compensation where the largest amount of noise error is likely to occur. It should be noted that if an odd number of pairs of conductive segments is implemented in connection with semiconductor device 400000, significant noise cancellation is provided. However, due to the odd number of conductive segment pairs, there would be one resulting region in which there would be no corresponding region having an opposite magnetic flux.

Figure 8:
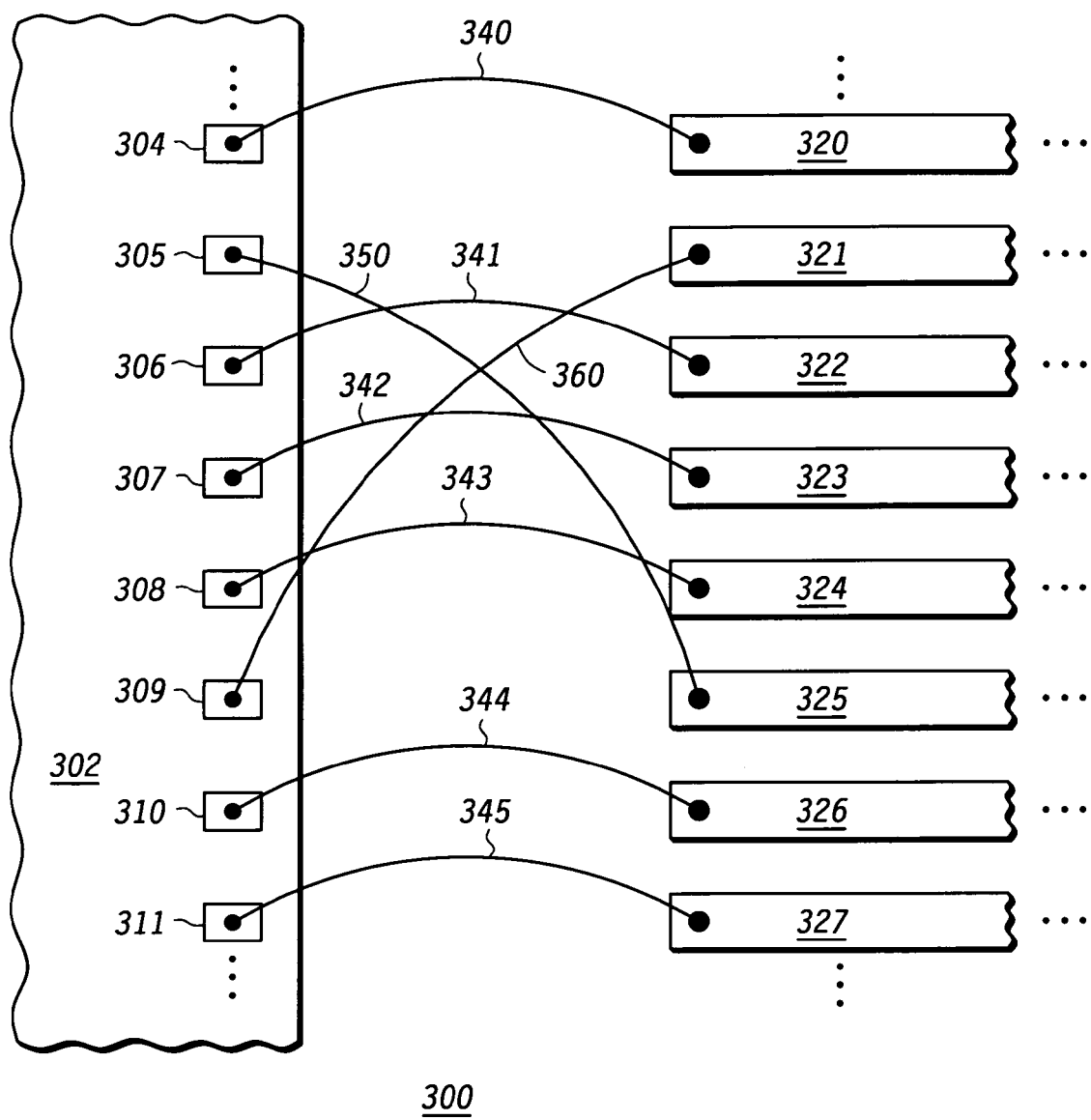
FIG. 8 illustrates in perspective form a semiconductor device having wire bonding in accordance with another form of the present invention.

Illustrated in FIG. 8 is a semiconductor device 300 generally having a die 302 with bond pads 304–311. Each of bond pads 304–311 is connected to a predetermined respective conductive trace by a bond wire. Bond pad 304 is connected to conductive trace 320 by bond wire 340. Bond pad 305 is connected to conductive trace 325 by bond wire 350. Bond pad 306 is connected to conductive trace 322 by bond wire 341. Bond pad 307 is connected to conductive trace 323 by bond wire 342. Bond pad 308 is connected to conductive trace 324 by bond wire 343. Bond pad 309 is connected to conductive trace 321 by bond wire 360. Bond pad 310 is connected to conductive trace 326 by bond wire 344. Bond pad 311 is connected to conductive trace 327 by bond wire 345. Other bond pads and conductive traces are present as indicated by the dotted lines.

In operation, semiconductor device 300 has two crossing bond wires, bond wires 350 and 360, that are respectively connected to bond pads 305 and 309. Intervening bond pads 307 and 308 are positioned on die 302. Assume either: (1) that bond pads 305 and 309 are electrically referenced to each other; or (2) that conductive traces 321 and 325 are electrically referenced to each other. Therefore, a magnetic coupling loop exists between the four points as a result of bond wires 350 and 360. The self inductance of the loop consisting of bond wire 350 and 360 is minimized due to the loop's geometry being two triangular shapes as opposed to a large rectangle as described above in FIG. 3. Either insulated or non-insulated wire may be used for bond wire 350 and 360. It should be noted that semiconductor device 300 intentionally crosses two bond wires that are not adjacent to each other and that have one or more intervening bond pads located between the connecting bond pads associated with the bond wires that are crossed. By crossing the two bond wires at a midpoint in each wire's length, or close to a midpoint, the self-inductance of each wire is reduced and cross-talk interference is reduced.

By now it should be appreciated that there has been provided an improved semiconductor package with an assembly using crossing conductors and method of manufacturing such a package. By using crossed bond wires and a crossing of conductive trace sections, self inductance of the associated conductors is decreased. The lower self inductance results in lower simultaneous switching noise and lower signal impedance discontinuity. Additionally, mutual inductance between the crossed bond wires and the conductive trace sections is decreased as a result of the cancellation of magnetic flux of opposite polarity in different areas.

In the foregoing specification, the invention has been described with reference to specific embodiments. However, one of ordinary skill in the art appreciates that various modifications and changes can be made without departing from the scope of the present invention as set forth in the claims below. For example, the present invention may be used in any wire bond devices. The crossed-wire and crossed trace structure may be used with differential signal pairs to decrease noise coupling. The package enhances the use of an RF signal and its return, the use of a power supply and ground, the use of a sensitive signal and its reference, and others. Any type of conductive material may be used for the conductive trace and bond wires. Typically, metal is used and typically gold, copper, silver, titanium, tungsten, aluminum and alloys thereof are used. Either insulated or non-insulated wire may be used for the bond wire. In order to reduce wire sweep resulting from mold injection, the wires may first be fixedly positioned by the use of a nonconductive glue. Accordingly, the specification and figures are to be regarded in an illustrative rather than a restrictive sense, and all such modifications are intended to be included within the scope of the present invention.

In one form there is provided an integrated circuit having a semiconductor die for wire-bonding to a plurality of conductive traces. A first substrate trace has a first end and a second end. A second substrate trace has a first end, the second substrate trace being laterally aligned with said first substrate trace. A first bonding pad is located on said semiconductor die, said first bonding pad being coupled to said first end of said second substrate trace using a first wire. A second bonding pad is laterally aligned with said first bonding pad and located on said semiconductor die. Said second bonding pad is coupled to said first end of said first substrate trace using a second wire. A third substrate trace has a first end, the first end of the third substrate trace being coupled to said second end of said first substrate trace using a third wire. The third wire crosses over the second substrate trace. In one form the third wire crosses over said second substrate trace at a location approximately midway between a first end and a second end of said third wire and approximately midway between said first end and a second end of said second substrate trace. In another form the size or the surface area of said first substrate trace and the size or surface area of said third substrate trace are approximately equal. In another form at least one aggressor signal generates an interfering magnetic field, said interfering magnetic field generating a first magnetic flux between said first substrate trace and said second substrate trace. The interfering magnetic field generates a second magnetic flux between the second substrate trace and the third substrate trace. The first magnetic flux cancels out a substantial portion of said second magnetic flux. In another form at least one of said first substrate trace, said second substrate trace, and said third substrate trace are made of copper or tungsten. A semiconductor die for wire-bonding to a plurality of conductive traces includes a first substrate trace having a first end and a second end. A second substrate trace has a first end and a-second end, the second substrate trace being laterally aligned with the first substrate trace. A first bonding pad is located on the semiconductor die. The first bonding pad is coupled to the first end of said second substrate trace using a first wire. A second bonding pad is laterally aligned with the first bonding pad and is located on the semiconductor die. The second bonding pad is coupled to the first end of the first substrate trace using a second wire. A third substrate trace has a first end, the first end being coupled to the second end of the second substrate trace using a third wire. A fourth substrate trace has a first end, the fourth substrate trace being laterally aligned with the third substrate trace. The first end of the fourth substrate trace is coupled to the second end of the first substrate trace using a fourth wire, wherein the third wire crosses the fourth wire. In another form the third wire and the fourth wire cross at a location approximately midway between a first end and a second end of the third wire and a first end and a second end of the fourth wire. In another form the sizes or surface areas of the first substrate trace, the second substrate trace, the third substrate trace, and the fourth substrate trace are approximately equal. In another form the at least one aggressor signal generates an interfering magnetic field, the interfering magnetic field generates a first magnetic flux between the first substrate trace and the second substrate trace. In another form the magnetic field generates a second magnetic flux between the third substrate trace and the fourth substrate trace, the first magnetic flux canceling out a substantial portion of the second magnetic flux. In another form the lengths of the third wire and the fourth wire are approximately equal. In another form a fifth substrate trace has a first end, the first end of the fifth substrate trace being coupled to a second end of the fourth substrate trace using a fifth wire. A sixth substrate trace has a first end, the sixth substrate trace being laterally aligned with the fifth substrate trace. The first end of the sixth substrate trace is coupled to a second end of the third substrate trace using a sixth wire. The fifth wire crosses the sixth wire. In another form the sizes or surface areas of the first substrate trace, the second substrate trace, the third substrate trace, the fourth substrate trace, the fifth substrate trace, and the sixth substrate trace are approximately equal.

In yet another form there is provided herein an integrated circuit having a semiconductor die for wire-bonding to a plurality of conductive traces. A substrate trace has a first end. A second substrate trace has a first end, the second substrate trace being laterally aligned with the first substrate trace. A first intervening substrate trace is located between the first substrate trace and the second substrate trace. The first intervening substrate trace has a first end. A first bonding pad is located on said semiconductor die. The first-bonding pad is coupled to the first end of the second substrate trace using a first wire. A second bonding pad is laterally aligned with the first bonding pad and is located on the semiconductor die. The second bonding pad is coupled to the first end of the first substrate trace using a second wire. A first intervening bonding pad is located between the first bonding pad and the second bonding pad. The first intervening bonding pad is coupled to the first end of the intervening substrate trace using a third wire, wherein the first wire crosses the second wire over the third wire. In another form the first wire and the second wire cross at a location approximately midway between a first end and a second end of the first wire and a first end and a second end of the second wire. In another form the first wire and the second wire are separated by a separation material, the separation material preventing direct contact between the first wire and said second wire. In another form the first wire and the second wire are approximately the same length. The word 'approximately' is herein used in a conventional dictionary meaning to be substantially or close to, if not the same. The use of approximately the same length wire or the same length wire is advantageous from a manufacturing standpoint because processing control is simplified. In another form at least one of the first substrate trace, the second substrate trace, and the first intervening substrate trace are made of copper or tungsten.

In another form there has herein been provided a method of forming an integrated circuit by providing a semiconductor die for wire-bonding to a plurality of conductive traces. The method includes providing a first substrate trace, the first substrate trace having a first end. A second substrate trace is provided, the second substrate trace having a first end. The second substrate trace is laterally aligned with said first substrate trace. A first bonding pad is provided on the semiconductor die. The first bonding pad is coupled to the first end of the second substrate trace using a first wire. A second bonding pad is provided on the semiconductor die. The second bonding pad is laterally aligned to the first bonding pad. The second bonding pad is coupled to the first end of the first substrate trace using a second wire, the second wire crossing the first wire. In another form the first wire and said second wire are crossed at a location approximately midway between a first end and a second end of the first wire and a first end and a second end of the second wire. In another form the first substrate trace and the second substrate trace are of equal dimensions, at least one of the first substrate trace and the second substrate trace is formed of copper or tungsten, and the first wire and the second wire are of equal length.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

The invention claimed is:

1. An integrated circuit comprising a semiconductor die for wire-bonding to a plurality of conductive traces comprising:
   a first substrate trace having a first end;
   a second substrate trace having a first end, said second substrate trace laterally aligned with said first substrate trace;
   a first intervening substrate trace located between said first substrate trace and said second substrate trace, said first intervening substrate trace having a first end;
   a first bonding pad located on said semiconductor die, said first bonding pad coupled to said first end of said second substrate trace using a first wire;
   a second bonding pad laterally aligned with said first bonding pad and located on said semiconductor die, said second bonding pad coupled to said first end of said first substrate trace using a second wire;

a first intervening bonding pad located between said first bonding pad and said second bonding pad, said first intervening bonding pad coupled to said first end of said first intervening substrate trace using a third wire, wherein said first wire crosses said second wire over said third wire.

2. The integrated circuit of claim 1, wherein said first wire and said second wire cross at a location approximately midway between a first end and a second end of said first wire and a first end and a second end of said second wire.

3. The integrated circuit of claim 2, wherein said first wire and said second wire are separated by a separation material, said separation material preventing direct contact between said first wire and said second wire.

4. The integrated circuit of claim 2, wherein said first wire and said second wire have approximately a same length.

5. The integrated circuit of claim 2, wherein at least one of said first substrate trace, said second substrate trace, and said first intervening substrate trace are made of copper or tungsten.

6. A method of forming an integrated circuit comprising providing a semiconductor die for wire-bonding to a plurality of conductive traces comprising:

determining at least one portion of the semiconductor die for reducing noise;

providing a first substrate trace, said first substrate trace having a first end;

providing a second substrate trace, said second substrate trace having a first end;

aligning said second substrate trace with said first substrate trace;

providing a first bonding pad on said semiconductor die;

coupling said first bonding pad to said first end of said second substrate trace using a first wire;

providing a second bonding pad on said semiconductor die;

aligning said second bonding pad to said first bonding pad;

coupling said second bonding pad to said first end of said first substrate trace using a second wire, said second wire crossing said first wire at substantially a midpoint of length of each wire to reduce noise;

providing at least one additional pair of bonding pads on the semiconductor die;

providing a plurality of aligned substrate traces offset from a periphery of said semiconductor die; and forming at least one adjoining pair of crossing wires that are positioned laterally adjacent to the first wire and second wire for reducing noise, each wire of the at least one adjoining pair of crossing wires respectively connecting a predetermined one of the at least one additional pair of bonding pads with a predetermined one of the plurality of aligned substrate traces and crossing with its correlated wire at substantially a midpoint of length of each wire.

7. The method of forming an integrated circuit as in claim 6 wherein the first wire, second wire and plurality of adjoining pairs of crossing wires comprises non-insulated wire.

8. The method of forming an integrated circuit as in claim 7 wherein said first substrate trace and said second substrate trace are of equal dimensions, at least one of said first substrate trace and said second substrate trace is comprised of copper or tungsten, and said first wire and said second wire are of equal length.

9. A method of forming a semiconductor device comprising a semiconductor die for wire-bonding to a plurality of conductive elements comprising:

providing a first conductor, said first conductor having a first end;

providing a second conductor, said second conductor having a first end;

providing a first bonding pad on said semiconductor die;

coupling said first bonding pad to said first end of said second conductor using a first wire;

providing a second bonding pad on said semiconductor die;

coupling said second bonding pad to said first end of said first conductor using a second wire, said second wire crossing said first wire only once;

providing an intervening conductor having at least a portion thereof between the first conductor and the second conductor, the intervening conductor having a first end;

providing an intervening bonding pad between the first bonding pad and the second bonding pad; and coupling a third wire from the intervening bonding pad to the first end of the intervening conductor, the third wire being below the first wire and the second wire.

10. The method of claim 9 further comprising:

using non-insulated wire for the first wire, the second wire and the third wire.

11. The method of claim 9 further comprising:

aligning the first conductor and the first bonding pad along a first axis; and aligning the second conductor and the second bonding pad along a second axis.

* * * * *